(12) United States Patent
Hayashida et al.

(10) Patent No.: US 10,636,972 B2
(45) Date of Patent: Apr. 28, 2020

(54) METHOD FOR PRODUCING PHOTOELECTRIC CONVERSION ELEMENT BY USING PHOTOELECTRIC CONVERSION FILM INCLUDING SEMICONDUCTING CARBON NANOTUBES HAVING DIFFERENT CHIRALITIES

(71) Applicant: Panasonic Intellectual Property Management Co., Ltd., Osaka (JP)

(72) Inventors: Kazunori Hayashida, Osaka (JP); Nozomu Matsukawa, Nara (JP); Katsuya Nozawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 15 days.

(21) Appl. No.: 15/961,975

(22) Filed: Apr. 25, 2018

(65) Prior Publication Data

US 2018/0331293 A1 Nov. 15, 2018

(30) Foreign Application Priority Data

May 15, 2017 (JP) .................................. 2017-096580

(51) Int. Cl.
*H01L 21/00* (2006.01)
*H01L 51/00* (2006.01)
*H01L 51/42* (2006.01)

(52) U.S. Cl.
CPC ...... *H01L 51/0025* (2013.01); *H01L 51/0007* (2013.01); *H01L 51/0036* (2013.01);
(Continued)

(58) Field of Classification Search
CPC .................... H01L 51/0007; H01L 51/0025
(Continued)

(56) References Cited

U.S. PATENT DOCUMENTS

2010/0072458 A1* 3/2010 Green .................. B03D 3/00
257/24
2010/0117032 A1* 5/2010 Grigorian ............ B82Y 30/00
252/507
(Continued)

FOREIGN PATENT DOCUMENTS

JP 2011-040435 2/2011
JP 2011-108763 6/2011
(Continued)

OTHER PUBLICATIONS

Keijiro Sakai et al., "Growth Position and Chirality Control of Single-Walled Carbon Nanotubes", IEICE Trans. Electron., vol. E94-C, No. 12, Dec. 2011, pp. 1861-1866.
(Continued)

*Primary Examiner* — Caleb E Henry
(74) *Attorney, Agent, or Firm* — McDermott Will & Emery LLP (57) ABSTRACT

A method for producing the photoelectric conversion element includes, in carbon nanotubes including semiconducting carbon nanotubes having different chiralities from each other and metallic carbon nanotubes, changing a chirality distribution in the semiconducting carbon nanotubes, separating the carbon nanotubes into the semiconducting carbon nanotubes and the metallic carbon nanotubes after changing the chirality distribution, covering the semiconducting carbon nanotubes with a polymer after performing separating, and forming a photoelectric conversion film including the semiconducting carbon nanotubes between a pair of electrodes after performing covering with the polymer.

24 Claims, 7 Drawing Sheets

(52) U.S. Cl.
CPC ...... *H01L 51/0039* (2013.01); *H01L 51/0046* (2013.01); *H01L 51/0048* (2013.01); *H01L 51/0049* (2013.01); *H01L 51/424* (2013.01); *H01L 51/4253* (2013.01)

(58) Field of Classification Search
USPC .......................................................... 438/82
See application file for complete search history.

(56) References Cited

U.S. PATENT DOCUMENTS

| | | | |
|---|---|---|---|
| 2011/0186785 A1* | 8/2011 | Kato .................. | B82Y 30/00 252/510 |
| 2014/0150855 A1* | 6/2014 | Inoue .................. | C01G 23/047 136/254 |
| 2016/0137505 A1 | 5/2016 | Nakashima et al. | |
| 2016/0221829 A1* | 8/2016 | Humfeld .............. | G01N 21/64 |
| 2016/0298030 A1* | 10/2016 | Papadimitrakopoulos .................. | C09K 11/65 |
| 2017/0029278 A1* | 2/2017 | Fasel .................. | C23C 16/44 |
| 2018/0016148 A1* | 1/2018 | Gui .................. | C01B 32/172 |

FOREIGN PATENT DOCUMENTS

| | | |
|---|---|---|
| JP | 2011-520262 | 7/2011 |
| JP | 2011-520263 | 7/2011 |
| JP | 2014-192480 | 10/2014 |
| JP | 2015-035599 | 2/2015 |
| WO | 2010/036397 | 4/2010 |
| WO | 2010/036398 | 4/2010 |
| WO | 2014/136981 | 9/2014 |

OTHER PUBLICATIONS

Rishabh M. Jain et al., "Polymer-Free Near-Infrared Photovoltaics with Single Chirality (6,5) Semiconducting Carbon Nanotube Active Layers", Advanced Materials, Wiley-VCH, vol. 24, Jun. 28, 2012, pp. 4436-4439.

Dominick J. Bindl et al., "Efficient Exciton Relaxation and Charge Generation in Nearly Monochiral (7,5) Carbon Nanotube/C60 Thin-Film Photovoltaics", The Journal of Physical Chemistry C, American Chemical Society, vol. 117, Jan. 16, 2013, pp. 2390-2395.

Constantine Y Khripin et al., "Spontaneous Partition of Carbon Nanotubes in Polymer-Modified Aqueous Phases", Journal of the American Chemical Society, American Chemical Society, vol. 135, Apr. 22, 2013, pp. 6822-6825.

Huaping Liu et al., "High-Efficiency Single-Chirality Separation of Carbon Nanotubes Using Temperature-Controlled Gel Chromatography", Nano Letters, American Chemical Society, vol. 13, Apr. 10, 2013, pp. 1996-2003.

Jeffrey A. Fagan et al., "Isolation of Specific Small-Diameter Single-Wall Carbon Nanotube Species via Aqueous Two-Phase Extraction", Advanced Materials, Wiley-VCH, vol. 26, Jan. 21, 2014, pp. 2800-2804.

\* cited by examiner

METHOD FOR PRODUCING PHOTOELECTRIC CONVERSION ELEMENT BY USING PHOTOELECTRIC CONVERSION FILM INCLUDING SEMICONDUCTING CARBON NANOTUBES HAVING DIFFERENT CHIRALITIES

BACKGROUND

1. Technical Field

The present disclosure relates to a method for producing a photoelectric conversion element and to a photoelectric conversion element.

2. Description of the Related Art

Optical characteristics and electrical characteristics of a single-walled carbon nanotube (hereinafter, SWCNT) vary considerably due to the differences in the sequence of carbon atoms and the diameter, that is, the differences in chirality.

For example, SWCNTs each have a specific absorption wavelength due to their respective chiralities. SWCNTs are classified into a semiconductor type and a metal type on the basis of their electrical characteristics.

KEIJIRO SAKAI et al., "Growth Position and Chirality Control of Single-Walled Carbon Nanotubes", IEICE TRANS. ELECTRON., The Institute of Electronics, Information and Communication Engineers, Vol. E94-C, No. 12, 2011, pp. 1861-1866 (hereinafter, Non-Patent Literature 1) reportes that it is possible to selectively grow only SWCNTs having a particular chirality by performing irradiation with a free-electron laser beam while the SWCNTs are growing by a chemical vapor deposition (CVD) method.

RISHABH M. JAIN et al., "Polymer-Free Near-Infrared Photovoltaics with Single Chirality (6, 5) Semiconducting Carbon Nanotube Active Layers", ADVANCED MATERIALS, WILEY-VCH, Vol. 24, 2012, pp. 4436-4439 (hereinafter, Non-Patent Literature 2) discloses that semiconducting SWCNTs with high purity can be used in an element by separating semiconducting SWCNTs by gel chromatography and transferring the SWCNTs to a substrate by a filtration-transfer method.

For example, Japanese Patent No. 5529115 discloses that all SWCNTs are wrapped by a polymer by a polymer wrapping method, so that direct contact between the SWCNTs is suppressed, and therefore energy transfer to metallic SWCNTs is suppressed.

DOMINICK J. BINDL et al., "Efficient Exciton Relaxation and Charge Generation in Nearly Monochiral (7,5) Carbon Nanotube/C60 Thin-Film Photovoltaics", THE JOURNAL OF PHYSICAL CHEMISTRY C, American Chemical Society, Vol. 117, 2013, pp. 2390-2395 (hereinafter, Non-Patent Literature 3) discloses that only specific semiconducting SWCNTs are selectively solubilized by a polymer wrapping method, so that the semiconducting SWCNTs and metallic SWCNTs are separated from each other, and therefore elements including only the semiconducting SWCNTs can be obtained.

SUMMARY

In one general aspect, the techniques disclosed here feature a method for producing the photoelectric conversion element including, in carbon nanotubes including semiconducting carbon nanotubes having different chiralities from each other and metallic carbon nanotubes, changing a chirality distribution in the semiconducting carbon nanotubes, separating the carbon nanotubes into the semiconducting carbon nanotubes and the metallic carbon nanotubes after changing the chirality distribution, covering the semiconducting carbon nanotubes with a polymer after performing separating, and forming a photoelectric conversion film including the semiconducting carbon nanotubes between a pair of electrodes after performing covering with the polymer.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Underlying Knowledge Forming Basis of the Present Disclosure

A photoelectric conversion element is an element that utilizes the optical characteristics of a substance and produces charge by light absorption. When the produced charge is output as energy, the photoelectric conversion element can be used as a solar cell. When the produced charge is detected as electric signals, the photoelectric conversion element can be used as an optical sensor, such as a solid-state image sensing device.

The study has been conducted, in which SWCNTs having characteristics not possessed by existing inorganic semiconductor materials, such as silicon, are used as a donor material for photoelectric conversion.

A SWCNT has a one-dimensional structure in which a graphene sheet is rolled up into a cylinder. The optical characteristics and electrical characteristics of a SWCNT change considerably due to the difference in diameter and the sequence of carbon atoms, that is, the difference in chirality.

The difference in the chirality is expressed by two integers (n, m) called chiral index. When the value of (n−m) is a multiple of 3, the valence band and the conduction band are in contact with each other, and thus a SWCNT is a metal type, otherwise a SWCNT is a semiconductor type.

In addition to the above-described electrical characteristics, the difference in chirality affects the optical characteristics. Since a SWCNT has van Hove singularity derived from its one-dimensional structure, the electronic density of state of the SWCNT is specifically high. A SWCNT has optical absorption caused by one-dimensional excitons in response to divergent electronic density of state.

A SWCNT has high carrier mobility. While a single-crystal silicon semiconductor has a carrier mobility of 1,500 $cm^2/Vs$, a SWCNT in an isolated state has a carrier mobility of 10,000 to 100,000 $cm^2/Vs$, which is larger by one digit or more. A deposited film in which SWCNTs are in contact with each other has a lower carrier mobility of 5 to 100 $cm^2/Vs$; however, the carrier mobility of the deposited film exceeds the carrier mobility (1 $cm^2/Vs$ or less) of organic semiconductors and amorphous silicon.

It has been found that the band gap of a SWCNT and resonance energy due to the van Hove singular point are substantially inversely proportional to the diameter. Thus, each SWCNT has a specific absorption wavelength due to its own chirality.

In particular, the first resonance energy ($ES^{11}$) of a semiconducting SWCNT has an absorption wavelength corresponding to a near-infrared region, and thus it is possible to have a gain in a wavelength region where the gain cannot be obtained by using a photoelectric conversion element including silicon as a photoelectric conversion material. For example, a solar cell including semiconducting SWCNTs achieves energy conversion by using near-infrared rays that a solar cell including silicon does not use for electric power generation. An optical sensor including semiconducting SWCNTs improves wavelength selectivity in optical sensing by using infrared rays, which people cannot see.

As a method for synthesizing SWCNTs, an arc discharge method, a laser vaporization method, or a CVD method is typically used. These methods have difficulty in selectively producing SWCNTs each having a specific chirality. Thus, SWCNTs having a certain chirality distribution are generally synthesized. A typical producing method provides SWCNTs in which one-third consists of metallic SWCNTs and two-thirds consists of semiconducting SWCNTs.

There are other techniques to selectively produce SWCNTs each having a specific chirality. Non-Patent Literature 1 reports that irradiation with a free electron laser beam while SWCNTs are growing by a CVD method enables selective growth of only SWCNTs having several semiconducting chiralities.

In using SWCNTs as a photoelectric conversion material, when metallic SWCNTs are present in a film, excitons rapidly transfer to the metallic SWCNTs and recombine therewith, thereby disturbing charge collection at an electrode. The dark current, which is a current that flows without light irradiation, increases. To prevent this, a process in which metallic SWCNTs are electrically deactivated or removed beforehand is needed.

For example, gel chromatography or aqueous two-phase extraction enables separation of SWCNTs into semiconducting SWCNTs and metallic SWCNTs. In Non-Patent Literature 2, semiconducting SWCNTs that have been separated by gel chromatography are transferred to a substrate by a filtration-transfer method, thereby producing a solar cell working successfully.

In Japanese Patent No. 5529115, SWCNTs are covered with a polymer by a wrapping method to reduce the contact between the SWCNTs, thereby suppressing energy transfer from semiconducting SWCNTs to metallic SWCNTs. Accordingly, carriers generated from the semiconducting SWCNTs are extracted and transferred to an electrode, and thus a photoelectric conversion element including the SWCNTs works successfully.

In the polymer wrapping method, polymer wrapping is performed in a solvent, such as toluene, xylene, or an analog thereof by using polyfluorene (PFO) or a PFO alternating copolymer, so that specific semiconducting SWCNTs can be selectively solubilized alone. In Non-Patent Literature 3, only specific semiconducting SWCNTs are selectively solubilized by the polymer wrapping method to separate semiconducting SWCNTs and metallic SWCNTs from each other to subsequently produce an element as a solar cell.

Polymer-wrapped SWCNTs dissolve in an organic solvent, so that the resulting solution can be used for production of elements as a coating ink.

The method described in Non-Patent Literature 1 is, however, not suitable for manufacture, because a free electron laser is considerably expensive, large-scale experimental equipment.

In the method for producing a photoelectric conversion element by the polymer wrapping method described in Japanese Patent No. 5529115, all SWCNTs including metallic SWCNTs are polymer-wrapped to produce a photoelectric conversion element, thereby causing the increase in the dark current and the decrease in photoelectric conversion efficiency.

In the method in Non-Patent Literature 2, selective separation of semiconducting SWCNTs by a polymer wrapping method enables elimination of the above-described effect of metallic SWCNTs; however, this process has a considerably low yield and is not suitable for manufacturing. Furthermore, only semiconducting SWCNTs having a specific chirality are covered with a polymer, so that the wavelength region where the semiconducting SWCNTs have absorption sensitivity is limited.

In the method in Non-Patent Literature 3, a photoelectric conversion element is produced without covering, with a polymer, semiconducting SWCNTs that are obtained by a method, such as gel chromatography, of separating SWCNTs into semiconducting SWCNTs and metallic SWCNTs, so that the semiconducting SWCNTs are directly in contact with each other and form bundles. Accordingly, the carrier mobility and the diffusion length of excitons decrease in the photoelectric conversion element, and the photoelectric conversion efficiency decreases.

The present disclosure provides a method for producing a photoelectric conversion element that has sensitivity in a wider wavelength range in a near-infrared-rays region and that is excellent in terms of mass production and a photoelectric conversion element.

A method for producing a photoelectric conversion element, according to a first aspect of the present disclosure includes, in carbon nanotubes including semiconducting carbon nanotubes having different chiralities from each other and metallic carbon nanotubes, changing a chirality distribution of the semiconducting carbon nanotubes, separating the carbon nanotubes into the semiconducting carbon nanotubes and the metallic carbon nanotubes after changing the chirality distribution, covering the semiconducting carbon nanotubes with a polymer after performing separating, and forming a photoelectric conversion film including the semiconducting carbon nanotubes between a pair of electrodes after performing covering with the polymer.

A method for producing a photoelectric conversion element, according to a second aspect of the present disclosure includes separating carbon nanotubes including semiconducting carbon nanotubes having different chiralities from each other and metallic carbon nanotubes into the semiconducting carbon nanotubes and the metallic carbon nanotubes, changing a chirality distribution of the semiconducting carbon nanotubes after performing separating, covering the semiconducting carbon nanotubes with a polymer after changing the chirality distribution, and forming a photoelectric conversion film including the semiconducting carbon nanotubes between a pair of electrodes after performing covering with the polymer.

Accordingly, semiconducting SWCNTs having a plurality of chiralities and high purity can be obtained by the methods for producing a photoelectric conversion element according to the first and second aspects of the present disclosure. The resulting semiconducting SWCNTs are covered with a polymer, so that bundling can be suppressed, and the high carrier mobility of SWCNTs can be retained without decreasing. In other words, each of the semiconducting SWCNTs is covered with a polymer, so that an element can be produced by using the semiconducting SWCNTs with each semiconducting SWCNT being in an isolated state and therefore can utilize the high carrier mobility, which is a characteristic of SWCNTs.

Accordingly, in the methods for producing a photoelectric conversion element according to the first and second aspects of the present disclosure, the semiconducting SWCNTs covered with a polymer can be used as a donor, thereby providing a photoelectric conversion element that has a sensitivity in a wider wavelength range in a near-infrared-rays region and that is excellent in terms of mass production. The wavelength range where the photoelectric conversion element has sensitivity is not limited to a specific wavelength range in a near-infrared-rays region, and the wavelength range where the photoelectric conversion element has sensitivity can be unrestrictedly changed in a near-infrared-rays region by selecting the chirality. Therefore, for example, a further benefit in which light having a wavelength in the infrared-rays region is usable in a solar cell and improvement in the wavelength selectivity of an optical sensor are achieved.

For example, in the methods for producing a photoelectric conversion element according to the first and second aspects of the present disclosure, the semiconducting carbon nanotubes may be covered with the polymer in an organic solvent in which the polymer is soluble.

Semiconducting SWCNTs are dispersed in an organic solvent in which the polymer dissolves, so that the polymer is likely to wind around the surfaces of the semiconducting SWCNTs. Accordingly, the surface of each of the semiconducting SWCNTs can be covered with the polymer.

For example, in the methods for producing a photoelectric conversion element according to the first and second aspects of the present disclosure, the organic solvent may be at least one selected from the group consisting of ortho-dichlorobenzene, chlorobenzene, and chloroform.

The use of such a medium polar solvent improves the dispersibility of SWCNT in an organic solvent. Furthermore, the dispersed SWCNTs can be covered regardless of the chirality thereof, that is, non-selectively. Accordingly, the yield of the polymer-wrapped SWCNTs can be increased. The polymer-wrapping is performed regardless of the chirality, thereby expanding the sensitive wavelength range of the photoelectric conversion element.

In the methods for producing a photoelectric conversion element according to the first and second aspects of the present disclosure, the organic solvent may be at least one selected from the group consisting of toluene and xylene.

The use of such a solvent with a small dipole moment avoids covering of metallic SWCNTs with a polymer, so that the metallic SWCNTs are not solubilized. Thus, the purity of semiconducting SWCNTs can be further improved after separating SWCNTs into semiconducting SWCNTs and metallic SWCNTs.

The use of a solvent with a small dipole moment enables selective covering of semiconducting SWCNTs having a specific chirality with a polymer. Thus, semiconducting SWCNTs having absorption sensitivity only in a specific wavelength range can be obtained with high purity.

For example, in the methods for producing a photoelectric conversion element according to the first and second aspects of the present disclosure, the carbon nanotubes may be separated into the semiconducting carbon nanotubes and the metallic carbon nanotubes by at least one selected from the group consisting of gel chromatography and aqueous two-phase extraction.

This enables large-scale and automated separation and therefore improves the productivity of the photoelectric conversion element.

For example, in the methods for producing a photoelectric conversion element according to the first and second aspects of the present disclosure, the carbon nanotubes may be separated into the semiconducting carbon nanotubes and the metallic carbon nanotubes by at least one selected from the group consisting of density-gradient centrifugation, selective solubilization, electrophoresis, and electrical breakdown.

These methods also enable separation of semiconducting carbon nanotubes.

For example, in the methods for producing a photoelectric conversion element according to the first and second aspects of the present disclosure, the polymer may be a semiconductive polymer.

This does not inhibit the carrier transport, and therefore the electric characteristics of the photoelectric conversion element does not decrease.

For example, the methods for producing a photoelectric conversion element according to the first and second aspects of the present disclosure may include removing part of the polymer that does not cover the semiconducting carbon nanotubes and that remains in the organic solvent from the organic solvent after performing covering with the polymer and before forming the photoelectric conversion film.

This further improves the purity of semiconducting SWCNTs.

For example, the methods for producing a photoelectric conversion element, according to the first and second aspects of the present disclosure, forming the photoelectric conversion film may include mixing the semiconducting carbon nanotubes and an n-type semiconductor material with each other and forming a photoelectric conversion film including the semiconducting carbon nanotubes and the n-type semiconductor material between the pair of electrodes.

This enables a smooth transfer of charge from the photoelectric conversion film to the electrode, thereby providing higher photoelectric conversion efficiency.

For example, in the methods for producing a photoelectric conversion element according to the first and second aspects of the present disclosure, the n-type semiconductor material may contain at least one selected from the group consisting of fullerene and a fullerene derivative.

This enables a smooth transfer of charge from the photoelectric conversion film to the electrode, thereby obtaining higher photoelectric conversion efficiency.

For example, in the methods for producing a photoelectric conversion element according to the first and second aspects of the present disclosure, the photoelectric conversion element may have absorption sensitivity to light having a wavelength range of 1,000 nm to 1,500 nm.

A photoelectric conversion element according to a third aspect of the present disclosure includes a photoelectric conversion film including semiconducting carbon nanotubes having a plurality of chiralities and a pair of electrodes sandwiching the photoelectric conversion film. The semiconducting carbon nanotubes are covered with a polymer. The concentration of metallic carbon nanotubes in the photoelectric conversion film is equal to the detection limit or less according to Raman spectroscopic analysis.

Accordingly, in the photoelectric conversion element according to the third aspect of the present disclosure, the photoelectric conversion film does not include metallic SWCNTs, so that charge is smoothly transferred from the photoelectric conversion film to the electrode and the dark current is decreased. Thus, the photoelectric conversion element according to the third aspect of the present disclosure achieves high photoelectric conversion efficiency.

For example, in the photoelectric conversion element according to the third aspect of the present disclosure, the photoelectric conversion film may further include an n-type semiconductor material.

This enables a smooth transfer of charge from the photoelectric conversion film to the electrode, thereby providing higher photoelectric conversion efficiency.

For example, the photoelectric conversion element according to the third aspect of the present disclosure may have an external quantum efficiency of 2% or more at a wavelength of 1,300 nm or more.

Accordingly, the photoelectric conversion element according to the third aspect of the present disclosure achieves a relatively high external quantum efficiency in a longer wavelength range in a near-infrared-rays region. Thus, the photoelectric conversion element achieves relatively high sensitivity in a wider range in the near-infrared-rays region.

Hereinafter, the detailed embodiment will be described with reference to the drawings.

The following description of the embodiment shows general or specific examples. Figures, shapes, materials, components, configurations and connections of the components, steps, and the order of the steps, which will be described in the following embodiment, are examples and not intended to limit the scope of the present disclosure. Among the components in the following embodiment, components that are not described in the independent claim showing the broadest concept are optional. Each figure is not necessarily an exact illustration. In each figure, the substantially same steps have the same symbols, and the duplicate description will be omitted or shortened where appropriate.

Embodiment

Hereinafter, the method for producing a photoelectric conversion element according to the embodiment of the present disclosure and the photoelectric conversion element will be described with reference to the drawings.

Hereinafter, SWCNTs including semiconducting SWCNTs and metallic SWCNTs are simply referred to as "SWCNTs".

Photoelectric Conversion Element

Figure 1:
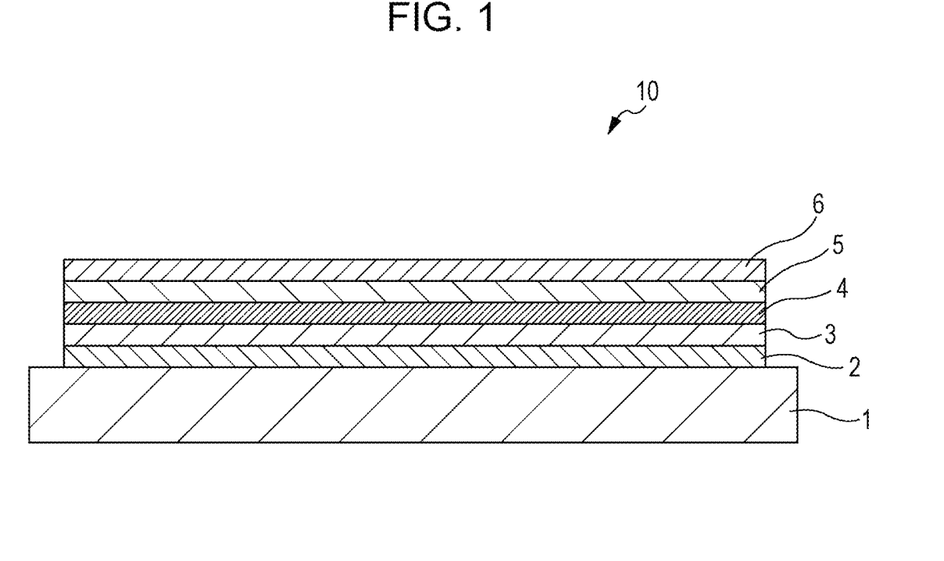
FIG. 1 is an exemplary schematic sectional view of a photoelectric conversion element according to an embodiment.

First, the photoelectric conversion element according to the embodiment will be described with reference to FIG. 1. FIG. 1 is an exemplary schematic sectional view of the photoelectric conversion element according to the embodiment. In FIG. 1, the scale is not taken in account, and unimportant components for describing the present disclosure are omitted.

As shown in FIG. 1, a photoelectric conversion element 10 according to the embodiment includes a photoelectric conversion film 4 disposed between a pair of electrodes including a lower electrode 2 and an upper electrode 6. In the embodiment, the photoelectric conversion film 4 includes a plurality of semiconducting SWCNTs that are covered with a polymer and that have different chiralities. Furthermore, the photoelectric conversion film 4 may include an n-type semiconductor material. The photoelectric conversion film 4 may be, for example, a bulk-heterojunction film formed by using a mixture of the semiconducting SWCNTs wrapped with a polymer (hereinafter, polymer-wrapped SWCNTs) and the n-type semiconductor material or a planar-heterojunction film in which a polymer-wrapped-SWCNT film and a n-type semiconductor film are stacked on each other.

The photoelectric conversion element 10 according to the embodiment may include an electron blocking layer 3 on the lower electrode 2. This suppresses electron injection from the lower electrode 2 to the photoelectric conversion film 4, thereby decreasing the dark current.

The photoelectric conversion element 10 may further include a hole blocking layer 5 between the photoelectric conversion film 4 and the upper electrode 6. This suppresses the hole injection from the upper electrode 6 to the photoelectric conversion film 4, thereby decreasing the dark current.

The above structure is used in the case where the lower electrode 2 collects holes, and the upper electrode 6 collects electrons. When the lower electrode 2 collects electrons and the upper electrode 6 collects holes, the positions of the electron blocking layer 3 and the hole blocking layer 5 may be exchanged.

Hereinafter, the features of the photoelectric conversion element 10 according to the embodiment will be described.

As shown in FIG. 1, the photoelectric conversion element 10 according to the embodiment is supported by, for example, a supporting substrate 1. The supporting substrate 1 is transparent, for example, at sensitive wavelengths of the semiconducting SWCNTs, so that light enters the photoelectric conversion element 10 through the supporting substrate 1. The supporting substrate 1 may be any substrate used for a typical photoelectric conversion element, for example, a glass substrate, a quartz substrate, a semiconductor substrate, or a plastic substrate. The expression "transparent at sensitive wavelengths of the semiconducting SWCNTs" means substantially transparent at sensitive wavelengths of the semiconducting SWCNTs, for example, light transmittance in the sensitive wavelength range of the semiconducting SWCNTs is 60% or more. The light transmittance in the sensitive wavelength range of the semiconducting SWCNTs may be 80% or more, or 90% or more. The supporting substrate 1 is not necessarily transparent.

The lower electrode 2 is formed on the supporting substrate 1. The lower electrode 2 may include an electroconductive material that is transparent at the sensitive wavelength of the semiconducting SWCNTs included in the photoelectric conversion film 4. In particular, in order to expand the sensitive wavelength to the near-infrared region, an electroconductive material having high transmittance of near-infrared rays may be used. This provides a transparent electroconductive oxide having high near-infrared transmittance and excellent electroconductivity. Examples of such materials include indium tin oxide (ITO), indium zinc oxide (IZO), aluminum-doped zinc oxide (AZO), $SnO_2$, $TiO_2$, and $ZnO_2$.

In the case where the lower electrode 2 collects holes, the electron blocking layer 3 may be disposed on the lower electrode 2. The electron blocking layer 3 transports holes between the electron blocking layer 3 and the lower electrode 2 and has a function to block the electron transport. The electron blocking layer 3 may include a material that has the highest occupied molecular orbital (HOMO) level near the Fermi level of the lower electrode 2 and the lowest unoccupied molecular orbital (LUMO) level at a distance farther from the Fermi level. This suppresses electron injection from the lower electrode 2 into the photoelectric conversion film 4, thereby decreasing the dark current.

In the photoelectric conversion element 10, when the semiconducting SWCNTs are used as a donor, the electron blocking layer 3 is formed by using a material having a lower electron affinity than that of the semiconducting SWCNTs. Such a material may be a p-type semiconductor or a hole-transporting material, for example, poly[(9,9-dioctyl-fluorenyl-2,7-diyl)-co-4,4'-(N-(4-sec-butylphenyl)diphenylamine)], N,N'-Di(1-naphthyl)-N,N'-diphenylbenzidine ($\alpha$-NPD), 4,4',4"-Tris[phenyl(m-tolyl)amino] triphenylamine (m-MTDATA), or poly(9,9-dioctylfluorene-co-N-(4-butylphenyl)diphenylamine) (TFB).

When the lower electrode 2 collects electrons, the hole blocking layer 5 is disposed between the lower electrode 2 and the photoelectric conversion film 4, instead of the electron blocking layer 3. The hole blocking layer 5 will be described later.

The photoelectric conversion film 4 is disposed between a pair of electrodes. The photoelectric conversion film 4 according to the embodiment includes polymer-wrapped SWCNTs and may further include an n-type semiconductor material. This enables a smooth transfer of charge from the photoelectric conversion film 4 to the electrode, thereby providing higher photoelectric conversion efficiency.

The n-type semiconductor material may be any acceptor-type semiconductor material, provided that it has higher electron affinity than the polymer-wrapped SWCNTs. Examples of materials include fullerene ($C_{60}$), fullerene derivatives, and condensed aromatic carbocyclic compounds (e.g., naphthalene derivatives, anthracene derivatives, phenanthrene derivatives, tetracene derivatives, pyrene derivatives, perylene derivatives, and fluoranthene derivatives). In the photoelectric conversion film 4 according to the embodiment, the n-type semiconductor material may include at least one of fullerene and fullerene derivatives. This enables a smooth transfer of charge from the photoelectric conversion film 4 to the electrode, thereby providing higher photoelectric conversion efficiency.

The photoelectric conversion film 4 may be a planar heterojunction film in which a layer of the polymer-wrapped SWCNTs and a layer of the n-type semiconductor material are stacked on each other or a bulk heterojunction film including the polymer-wrapped SWCNTs and the n-type semiconductor material mixed with each other. This reduces element resistance, thereby improving charge transfer efficiency from the photoelectric conversion film 4 to the electrode. Of the two films, a bulk heterojunction film may be used because the film has a larger contact area between the donor and the acceptor and therefore improves exciton dissociation efficiency.

In the photoelectric conversion film 4, the concentration of metallic carbon nanotubes may be equal to the detection limit or less according to Raman spectroscopic analysis. Accordingly, the photoelectric conversion film 4 according to the embodiment does not include metallic SWCNTs, and thus charge is smoothly transferred from the photoelectric conversion film 4 to the electrode, thereby reducing the dark current. This enables the photoelectric conversion element 10 according to the embodiment to have high photoelectric conversion efficiency.

When the electron blocking layer 3 is disposed on the lower electrode 2, the hole blocking layer 5 may be disposed between the photoelectric conversion film 4 and the upper electrode 6. The hole blocking layer 5 transports electrons between the upper electrode 6 and the hole blocking layer 5 and has a function to block the hole transport. The hole blocking layer 5 may include a material that has the LUMO level near the Fermi level of the upper electrode 6 and the HOMO level at a distance farther from the Fermi level. This suppresses hole injection from the upper electrode 6 into the photoelectric conversion film 4, thereby decreasing the dark current.

In the photoelectric conversion element 10, when the semiconducting SWCNTs are used as a donor, the hole blocking layer 5 is formed by using a material having a higher ionization potential than that of the semiconducting SWCNTs. Thus, an n-type semiconductor or an electron-transporting material may be used.

Examples of such materials include $C_{60}$ and bathocuproine (BCP).

The upper electrode 6 is disposed on the photoelectric conversion film 4, or, when the hole blocking layer 5 is disposed, on the hole blocking layer 5. The material used for the upper electrode 6 may be a material to which electrons can be extracted from the photoelectric conversion film 4 or the hole blocking layer 5 and from which the hole injection into the film and the layer is less likely to occur. Thus, for example, Al or Ag, which has an electron affinity of less than 4.3 eV, may be used.

Method for Producing Photoelectric Conversion Element

Figure 2A:
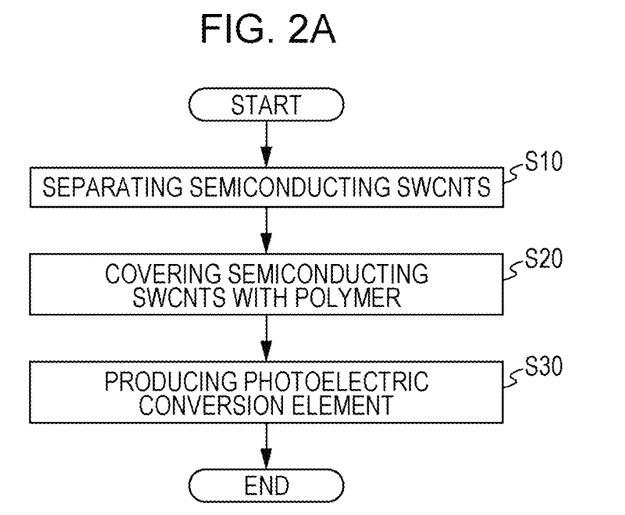
FIG. 2A is a flowchart describing an exemplary process of a method for producing the photoelectric conversion element according to the embodiment.
Figure 2B:
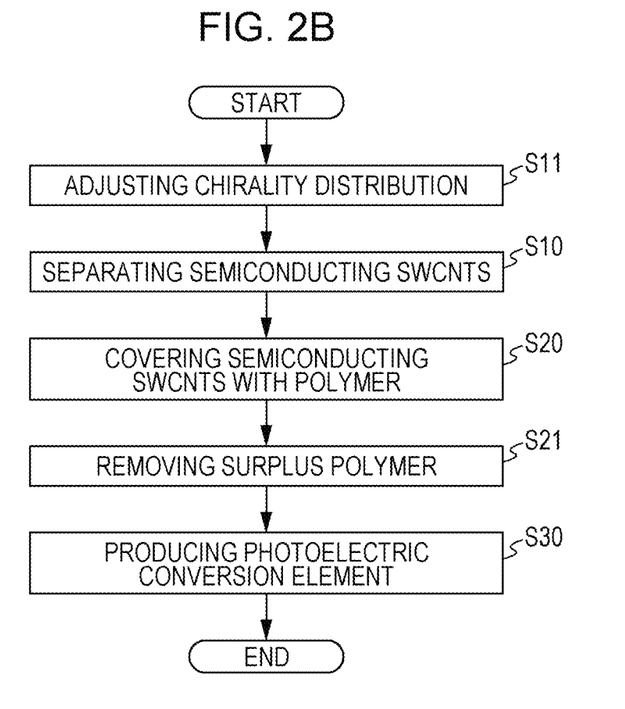
FIG. 2B is a flowchart describing another exemplary process of the method for producing the photoelectric conversion element according to the embodiment.

A method for producing the photoelectric conversion element according to the embodiment will be described with reference to FIGS. 2A and 2B. FIG. 2A is an illustration of an exemplary process of the method for producing the photoelectric conversion element according to the embodiment. FIG. 2B is an illustration of another exemplary process of the method for producing the photoelectric conversion element according to the embodiment.

As shown in FIG. 2A, an exemplary process of the method for producing the photoelectric conversion element according to the embodiment includes a first step (S10) of separating semiconducting SWCNTs from SWCNTs in which semiconducting SWCNTs and metallic SWCNTs are mixed together, a second step (S20) of covering the obtained semiconducting SWCNTs with a polymer, and a third step (S30) of producing a photoelectric conversion element by forming the polymer-covered semiconducting SWCNTs into a photoelectric conversion film between a pair of electrodes.

As shown in FIG. 2B, another exemplary process of the method for producing the photoelectric conversion element according to the embodiment further includes a fourth step (S11) of adjusting the chirality distribution of the semiconducting SWCNTs to a desired distribution by changing the distribution and a fifth step (S21) of removing surplus polymers that have not covered the semiconducting SWCNTs and that remain in the second step (S20). The fourth step (S11) is performed before the second step (S20). The forth step (S11) may be performed between the first step (S10) and the second step (S20).

Hereinafter, each step will be described in detail.

Step of Providing SWCNTs

In this step, which is not illustrated, SWCNTs in which semiconducting SWCNTs and metallic SWCNTs are mixed together are first synthesized to be provided. The method for synthesizing SWCNTs is not limited in the embodiment and may be a CVD method or an arc discharge method. The different synthesizing methods provide SWCNTs having different properties, such as chirality distribution, length, and purity. When SWCNTs are used as a photoelectric conversion device, SWCNTs synthesized by an appropriate synthetic method may be selected in accordance with desired device properties, such as sensitive wavelength.

First Step

In the first step, semiconducting SWCNTs are separated from SWCNTs.

When SWCNTs are used as a photoelectric conversion film, metallic SWCNTs deactivate excitons and charge, thereby deteriorating efficiency. In addition, the metallic SWCNTs become a factor for increasing the dark current. Thus, metallic SWCNTs are removed in the first step.

The method for separating semiconducting SWCNTs from SWCNTs may be gel chromatography, aqueous two-phase extraction, or a combination thereof. These separation techniques are suitable for large-scale and automated separation and are usable in manufacturing and increase the productivity of the photoelectric conversion element including SWCNTs. Another separation method may be one or a combination of known density-gradient centrifugation, selective solubilization, electrophoresis, and electrical breakdown. These methods also enable separation of semiconducting carbon nanotubes.

In this separation step, all semiconducting SWCNTs included in SWCNTs need not be separated. Metallic SWCNTs do not remain in the separated semiconducting SWCNTs, thereby suppressing the decrease in the photoelectric conversion efficiency and the increase in the dark current.

The presence of metallic SWCNTs can be confirmed by the RBM peaks of Raman spectrometry. Resonance occurs at a plurality of wavelengths in SWCNTs, and the wavelengths at which resonance occurs vary in accordance with chiralities. In this specification, among resonances of SWCNTs, the resonance that occurs at the longest wavelength is referred to as a first resonance, the resonance that occurs at the second longest wavelength is referred to as a second resonance, and the resonance that occurs at the third longest wavelength is referred to as a third resonance. The same correspondence applies to higher number resonances.

Figure 3:
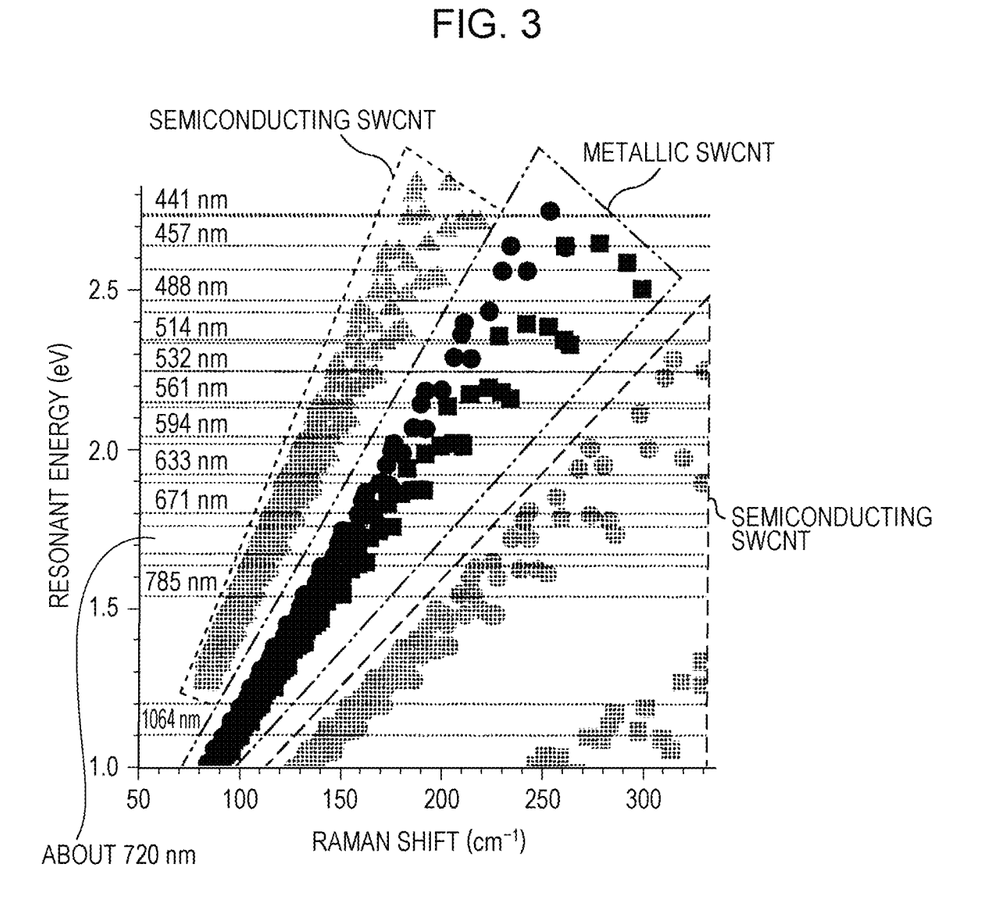
FIG. 3 is a graph in which radial-breathing mode (RBM) peaks of semiconducting SWCNTs and metallic SWCNTs at various excitation wavelengths are plotted.

The Raman scattering of SWCNTs is observed only when SWCNTs are excited at a wavelength near the wavelength at which resonance occurs. Among a plurality of peaks observed in the Raman scattering spectrum, the RBM peaks have properties in which the peaks appear at different wave numbers in accordance with chiralities. FIG. 3 illustrates the relation between the resonance wavelength and RBM peaks of SWCNTs having various chiralities. These are theoretical calculations and may be different from the actual measurements by a few wave numbers due to the circumstance where the SWCNTs are disposed. In FIG. 3, a rectangular dot represents the RBM peak of the first resonance, a circular dot represents the RBM peak of the second resonance, and a triangle dot represents the RBM peak of the third resonance. As shown in FIG. 3, the RBM peaks of the first resonance and the second resonance of metallic SWCNTs are present in a region between a region of the RBM peaks of the second resonance and a region of the RBM peaks of the third resonance of semiconducting SWCNTs.

Raman scattering at an excitation wavelength confirms the presence of only metallic SWCNTs that have a resonance wavelength near the excitation wavelength. Thus, the presence of the metallic SWCNTs may be confirmed by using a plurality of excitation wavelengths. The kinds of chiralities of SWCNTs are substantially determined in accordance with a synthetic method and conditions. Therefore, the presence of metallic SWCNTs may be confirmed in consideration of the range of chiralities that SWCNTs are likely to have by the synthetic method and conditions.

Hereinafter, the first step of the embodiment will be described with reference to specific examples.

In the embodiment, semiconducting SWCNTs are separated from SWCNTs by, for example, known aqueous two-phase extraction. An outline of an exemplary process of the aqueous two-phase extraction is as follows.

(1) First, SWCNTs are added to a 2% aqueous sodium cholate solution and dispersed by an ultrasonic homogenizer. Then, a monodispersed component is extracted alone by ultracentrifugation to obtain a SWCNT dispersion liquid.

(2) Next, 15 mL of a 20% aqueous dextran solution, 6 mL of a 50% aqueous polyethylene glycol solution, 5 mL of a 10% aqueous sodium cholate solution, 13 mL of pure water, and 0.5 mL of 100 mM hypochlorous acid are mixed together to prepare an aqueous two-phase solution. To the resulting aqueous two-phase solution, 5 mL of the SWCNT dispersion liquid is added, stirred, and then kept stationary.

(3) After the resulting liquid is kept stationary, an upper layer of the two separated phase is collected. In this case, the upper layer includes semiconducting SWCNTs and the lower layer includes metallic SWCNTs. Thus, when the upper layer is collected alone, a SWCNT extraction liquid is obtained, which includes the metallic SWCNTs less than the SWCNT dispersion liquid, that is, which includes the semiconducting SWCNTs more than the SWCNT dispersion liquid.

After repeating the above procedures (2) and (3) several times, the metallic SWCNTs are removed to a concentration that is not able to be detected by Raman spectrometry, and the semiconducting SWCNTs are obtained with high purity.

The procedure of the aqueous two-phase extraction is described in detail, for example, in CONSTANTINE Y KHRIPIN et al., "Spontaneous Partition of Carbon Nanotubes in Polymer-Modified Aqueous Phases", JOURNAL OF THE AMERICAN CHEMICAL SOCIETY, American Chemical Society, Vol. 135, 2013, pp. 6822-6825 (Non-Patent Literature 4). Examples of methods for separating SWCNTs into semiconducting SWCNTs and metallic SWCNTs include gel chromatography, another separation method, and a combination of the above in addition to the aqueous two-phase extraction.

Here, it was confirmed by the following method that in the semiconducting SWCNTs obtained in the first step, the concentration of the metallic SWCNTs was equal to the detection limit or less, in other words, the metallic SWCNTs were not included.

Figure 4A:
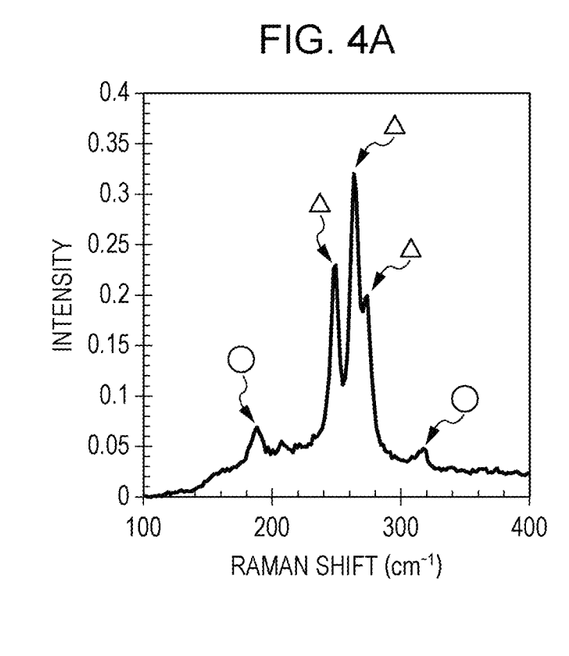
FIG. 4A shows a Raman spectrum of SWCNTs at an excitation wavelength of 514 nm.
Figure 4B:
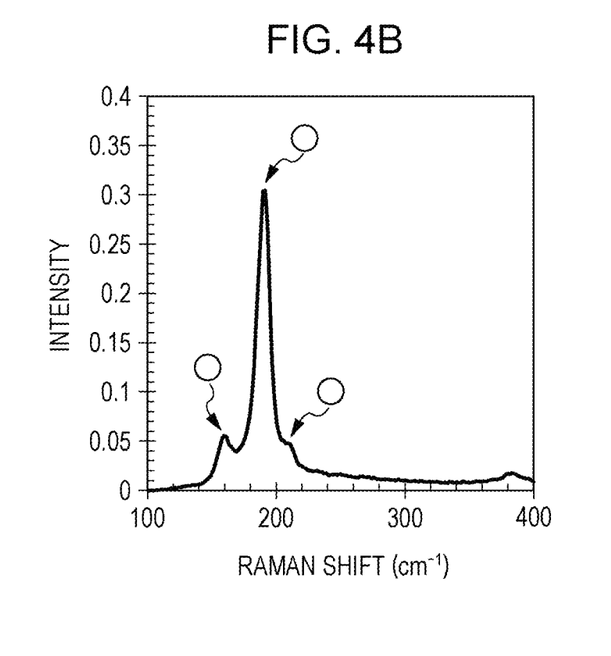
FIG. 4B shows a Raman spectrum of the semiconducting SWCNTs at an excitation wavelength of 514 nm.

FIG. 4A illustrates the Raman spectrum of SWCNTs at an excitation wavelength of 514 nm. FIG. 4B illustrates the Raman spectrum of semiconducting SWCNTs at an excitation wavelength of 514 nm. The semiconducting SWCNTs in FIG. 4B are the semiconducting SWCNTs obtained in the first step.

Referring to FIG. 3 again, the RBM peaks of metallic SWCNTs appear in a wave number range of about 200 cm$^{-1}$ to 300 cm$^{-1}$ at an excitation wavelength of 514 nm. The RBM peaks that appear in a wave number range of about 200 cm$^{-1}$ or less and about 300 cm$^{-1}$ or more are derived from semiconducting SWCNTs.

In FIG. 4A, peaks at which triangles point are assigned to metallic SWCNTs. In FIGS. 4A and 4B, peaks at which circles point are assigned to semiconducting SWCNTs.

As shown in FIG. 4A, the RBM peaks of metallic SWCNTs were observed in the Raman spectrum of SWCNTs. As shown in FIG. 4B, only the RBM peaks of semiconducting SWCNTs were observed in the Raman spectrum of the semiconducting SWCNTs that were obtained after separation of SWCNTs into semiconducting SWCNTs and metallic SWCNTs in the first step. Thus, it was confirmed that in the semiconducting SWCNTs obtained in the first step, the concentration of metallic SWCNTs was equal to the detection limit or less, in other words, metallic SWCNTs were not included.

The absorption spectra of the dispersion liquids of semiconducting SWCNTs and metallic SWCNTs that were separated in the first step and the absorption spectrum of the dispersion liquid of SWCNTs before separation were each measured.

Figure 5:
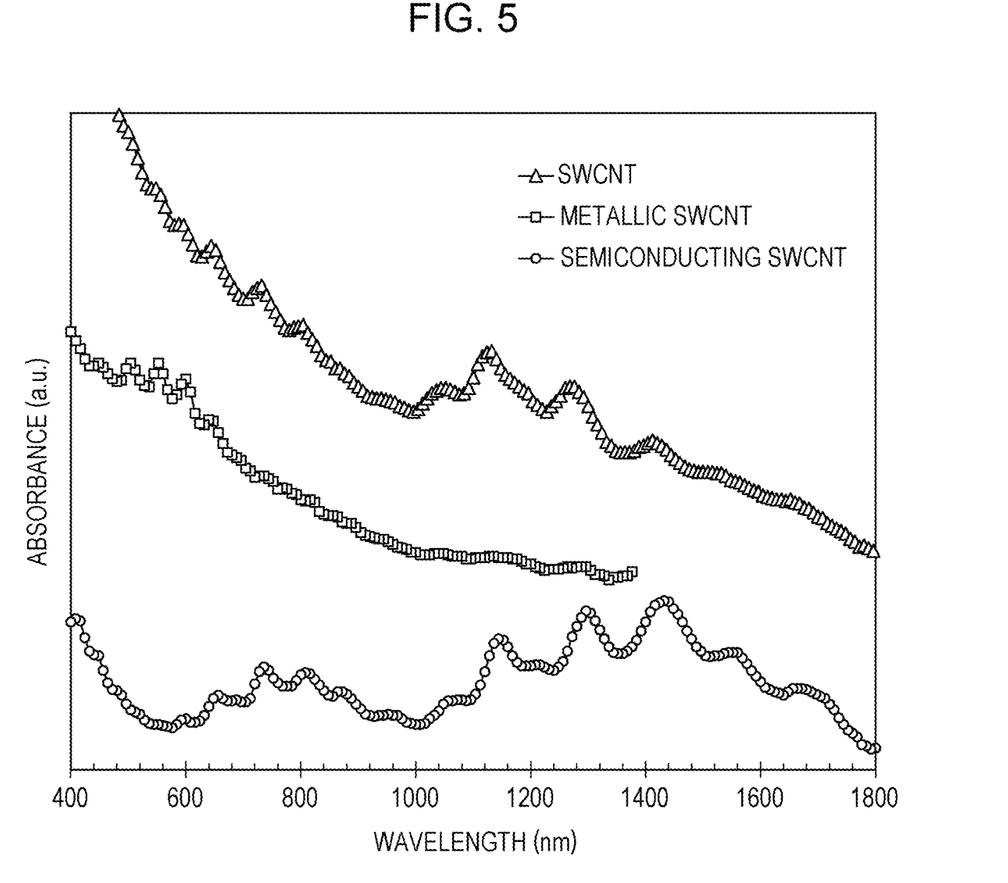
FIG. 5 shows absorption spectra of a semiconducting SWCNT dispersion liquid and a metallic SWCNT dispersion liquid after separation and a SWCNT dispersion liquid.

FIG. 5 illustrates absorption spectra of the SWCNT dispersion liquid and the dispersion liquids of semiconducting SWCNTs and metallic SWCNTs that were obtained by separating the SWCNTs into the semiconducting SWCNTs and the metallic SWCNTs. FIG. 5 includes plots of absorbance: the absorbance of the SWCNTs before the separation into the semiconducting SWCNTs and the metallic SWCNTs, represented by the triangle dots; the absorbance of the metallic SWCNTs, represented by the rectangular dots; and the absorbance of the semiconducting SWCNTs, represented by the circular dots.

As shown in FIG. 5, the absorbance of the metallic SWCNTs decreased from left to right, which is typical of the metal type, and the absorption peaks were confirmed in the visible light region. Regarding the semiconducting SWCNTs, the peaks derived from the first resonance (1,000 to 1,800 nm), the second resonance (600 to 1,000 nm), and the third resonance (<600 nm) of the semiconducting SWCNTs were clearly confirmed. This showed that SWCNTs were separated into semiconducting SWCNTs and metallic SWCNTs.

As described above, in the first step, a high-purity dispersion liquid of semiconducting SWCNTs is obtained by, for example, aqueous two-phase extraction. The dispersion liquid of semiconducting SWCNTs, which is obtained in this step, is an aqueous solution including polyethylene glycol, sodium cholate, and the like. Thus, in addition to the above procedure, a process in which only semiconducting SWCNTs are collected is further performed. Semiconducting SWCNTs were collected alone from the dispersion liquid of semiconducting SWCNTs by the following method, as one example.

The dispersion liquid of semiconducting SWCNTs was filtered by suction by using a membrane filter with a pore size of 0.2 μm. Furthermore, an excess amount of pure water was filtered by suction to wash away impurities remaining on the membrane filter. Accordingly, the semiconducting SWCNTs remained alone on the membrane filter. Subsequently, the membrane filter was dried, and an aggregation film of the semiconducting SWCNTs, which was formed on the membrane filter, was peeled off.

Next, to confirm whether the obtained semiconducting SWCNTs were highly purified, a photoluminescence excitation (PLE) spectrum of the aggregation film of the semiconducting SWCNTs was measured. To compare with the case in which metallic SWCNTs were included, a PLE spectrum of the aggregation film of SWCNTs before the separation into semiconducting SWCNTs and metallic SWCNTs was also measured.

Figure 6A:
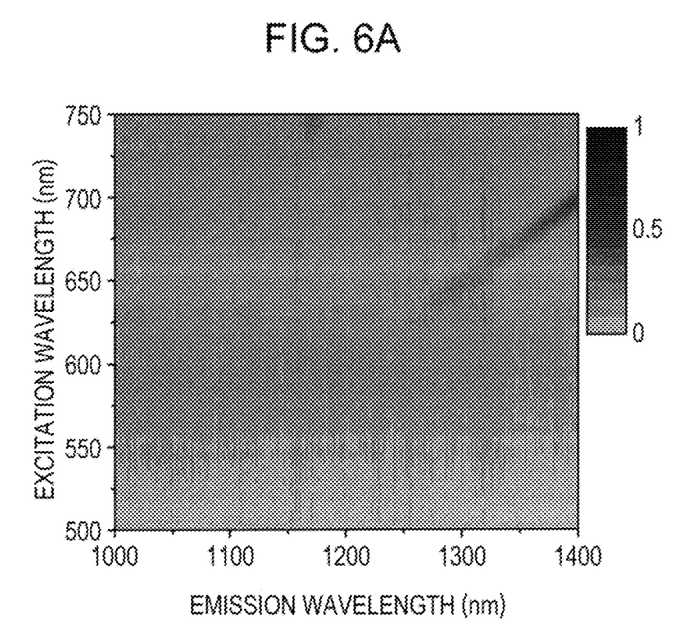
FIG. 6A shows a photoluminescence excitation (PLE) spectrum of an aggregation film of the SWCNTs.
Figure 6B:
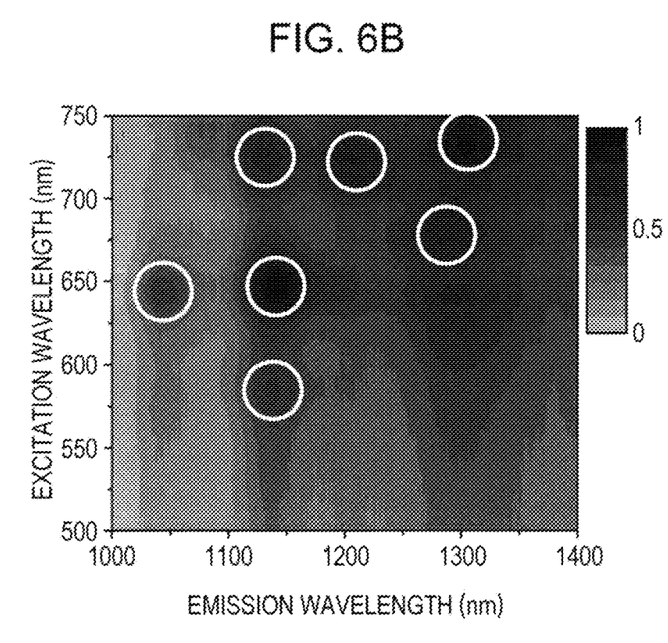
FIG. 6B shows a PLE spectrum of an aggregation film of the semiconducting SWCNTs.

FIG. 6A shows a PLE spectrum of the aggregation film of SWCNTs. FIG. 6B shows a PLE spectrum of the aggregation film of semiconducting SWCNTs. In FIG. 6B, the peaks derived from the semiconducting SWCNTs are surrounded by circles. Each circle shows luminescence from a semiconducting SWCNT having a specific chirality.

As shown in FIG. 6A, when metallic SWCNTs are included, excitons transfer the energy thereof to the metallic SWCNTs and are deactivated nonradiatively, so that fluorescence is not observed. However, in FIG. 6B, the PLE spectra were clearly observed in the wavelength region of about 1,050 nm or more in response to the chiralities. Accordingly, it was confirmed that the semiconducting SWCNTs obtained in the first step were highly purified without being mixed with metallic SWCNTs.

Second Step

In the second step, semiconducting SWCNTs obtained in the first step are covered with a polymer.

The polymer may be a polymer that is to be wound around SWCNTs and may also be a semiconductive polymer. When a polymer that covers the semiconducting SWCNTs is a semiconductive polymer, because the semiconductive polymer is less likely to inhibit the carrier transport, an effect on the electrical characteristics of the semiconducting SWCNTs can be suppressed even if surplus polymers are present. In detail, when the energy level of the HOMO of the semiconductive polymer is higher than that of the HOMO of the semiconducting SWCNTs, the hole transfer from the semiconducting SWCNTs to the semiconductive polymer occurs more smoothly.

Examples of such polymers include polyfluorene (hereinafter, PFO), PFH-BT (CAS NO. 210347-52-7), Activelnk N2200 (trade name, manufactured by Polyera Corporation), and Poly(3-hexylthiophene-2,5-diyl) (P3HT). The energy level of the HOMO of P3HT is high, and thus P3HT is suitable for the hole transport.

In the second step, covering with a polymer may be performed in an organic solvent in which the polymer is soluble. Semiconducting SWCNTs are dispersed in an organic solvent in which the polymer is dissolved, so that the polymer is likely to be wound around the surfaces of the semiconducting SWCNTs. Thus, the surface of each semiconducting SWCNT may be covered with the polymer.

The organic solvent may be one of ortho-dichlorobenzene, chlorobenzene, and chloroform. The use of such a medium polar solvent improves the dispersibility of SWCNTs and increases the yield. In addition, SWCNTs can be nonselectively covered regardless of chirality, thereby expanding the sensitive wavelength range of the photoelectric conversion element. However, when such a medium polar solvent is used, SWCNTs are nonselectively covered with a polymer, so that if metallic SWCNTs are present, the metallic SWCNTs are also covered. As described above, the presence of metallic SWCNTs in the photoelectric conversion element deteriorates the efficiency and increases the dark current. Thus, when an organic solvent, such as ortho-dichlorobenzene, chlorobenzene, or chloroform is used, metallic SWCNTs are removed beforehand in the first step.

In the second step, to selectively cover the semiconducting SWCNTs with a polymer, a low dipole moment solvent, such as toluene or xylene, may be used. In this case, metallic SWCNTs are not covered with a polymer, so that the metallic SWCNTs are not solubilized. Thus, the semiconducting SWCNTs are expected to be more highly purified. When such a low dipole moment solvent is used, semiconducting SWCNTs having a specific chirality can be selectively covered with a polymer. Thus, this is effective when highly purified semiconducting SWCNTs having absorption sensitivity only in a specified wavelength range are desired to obtain.

Hereinafter, the second step will be specifically described in detail.

In the second step, PFO was dissolved in monochlorobenzene, for example, at a concentration of 1 mg/mL. Semiconducting SWCNTs were further added to the solution, and then the resulting solution was subjected to ultrasonic treatment. This process provided SWCNTs covered with PFO. When other polymers are used, semiconducting SWCNTs can be covered in accordance with a similar procedure.

Here, the fifth step may be performed, in which surplus polymers that have not covered the SWCNTs and remain are removed. This improves the purity of semiconducting SWCNTs.

In the fifth step, for example, the dispersion liquid, which is obtained in the second step, of the semiconducting SWCNTs covered with a polymer (hereinafter, polymer-wrapped SWCNTs) is filtered by suction by using a membrane filter with a pore size of 0.2 Furthermore, a surplus amount of monochlorobenzene is filtered by suction to wash away the surplus polymers remaining on the membrane filter. Subsequently, the membrane filter on which the polymer-wrapped SWCNTs are collected is immersed in monochlorobenzene and subjected to ultrasonic treatment to re-disperse the polymer-wrapped SWCNTs. This provides a dispersion liquid of the polymer-wrapped SWCNTs from which surplus polymers are removed.

Third Step

In the third step, the polymer-wrapped SWCNTs obtained in the second step are formed into a photoelectric conversion film between a pair of electrodes to thereby produce a photoelectric conversion element.

In the third step, the polymer-wrapped SWCNTs are mixed with the n-type semiconductor material, and the material mixture may be formed into a photoelectric conversion film between a pair of electrodes. In other words, photoelectric conversion film according to the embodiment may be a bulk-heterojunction film.

Referring to FIG. 1 again, the third step will be described.

In the third step, the lower electrode 2 is first formed on the supporting substrate 1. The method for forming the lower electrode 2 is not particularly limited, and various methods may be performed depending on a material used. For example, when ITO is used, a chemical reaction method, such as an electron beam method, a sputtering method, a resistive thermal evaporation method, and a sol-gel method, and coating with a dispersion of ITO may be performed. In this case, after an ITO film is formed, UV-ozone treatment or plasma treatment may be further performed.

When the lower electrode 2 collects holes, the electron blocking layer 3 may be formed on the lower electrode 2. The electron blocking layer may be PEDOT: PSS, which is a composite of poly(3,4-ethylenedioxythiophene) (PEDOT) and polystyrenesulfonate (PSS).

Next, the photoelectric conversion film 4 is formed on the electron blocking layer 3. The method for forming the photoelectric conversion film 4 is not particularly limited, and examples of such methods include application methods, such as spray coating, ink-jetting, spin coating, push coating, dip coating, and blade coating. A dry method, such as a transfer method or a laminate method may be performed.

When the photoelectric conversion film 4 is formed by spray coating, fullerene ($C_{60}$), as an n-type semiconductor material, is dissolved in the dispersion liquid of the polymer-wrapped SWCNTs, which is obtained in the second step, to prepare a solution for the photoelectric conversion film. The prepared solution for the photoelectric conversion film is applied to the electron blocking layer 3 by spray coating to form the photoelectric conversion film 4 on the electron blocking layer 3. In this case, the photoelectric conversion film 4 obtained by the above-described procedure is a bulk heterojunction film of the donor and the acceptor.

After a polymer-wrapped SWCNTs film is formed by using polymer-wrapped SWCNTs, an n-type semiconductor film may be formed on the polymer-wrapped SWCNTs film by using the n-type semiconductor material to form a planar heterojunction film of the donor and the acceptor. Alternatively, a polymer-wrapped SWCNTs film may be formed alone without forming an n-type semiconductor film to produce a donor-only element.

Next, the hole blocking layer 5 is formed on the photoelectric conversion film 4. The hole blocking layer 5 is formed, for example, by placing the substrate to which the photoelectric conversion film 4 is applied into a vacuum evaporation apparatus and depositing fullerene (CH) on the photoelectric conversion film 4 by vacuum-evaporation.

Subsequently, the upper electrode 6 is formed. For example, Al is used as a material for the upper electrode 6, and Al is vacuum-evaporated onto the hole blocking layer 5 to form the upper electrode 6.

The above-described procedure provides the photoelectric conversion element 10 according to the embodiment, which is illustrated in FIG. 1.

Fourth Step

The method for producing the photoelectric conversion element according to the embodiment may further include a fourth step of changing the chirality distribution of the semiconducting SWCNTs. The fourth step may be performed before the second step. For example, the fourth step may be performed before or after the first step of separating the semiconducting SWCNTs from the SWCNTs.

An example of the step of changing chirality distributions is gel chromatography. For example, the adsorptivity of SWCNTs dispersed by using a surfactant to Sephacryl gel varies depending on the chiralities of the SWCNTs. Thus, when the SWCNT dispersion liquid containing a surfactant is caused to pass through Sephacryl gel and the amount of SWCNTs is sufficient relative to the amount of the gel, semiconducting SWCNTs having a chirality with high adsorptivity to the gel are adsorbed to the gel. In contrast, semiconducting SWCNTs having a chirality with low adsorptivity to the gel are not adsorbed to the gel and pass it through. The semiconducting SWCNTs adsorbed to the gel are individually eluted by using different surfactants, thereby collecting the semiconducting SWCNTs having different chiralities separately.

Such a procedure may change the chirality distribution of semiconducting SWCNTs. A method of using aqueous two-phase extraction is also known as a method for changing the chirality distribution of semiconducting SWCNTs. The steps of changing the chirality distribution of SWCNTs is described in detail, for example, in HUAPING LIU et al., "High-Efficiency Single-Chirality Separation of Carbon Nanotubes Using Temperature-Controlled Gel Chromatography", NANO LETTERS, American Chemical Society, Vol. 13, 2013, pp. 1996-2003 (hereinafter, Non-Patent Literature 5) and JEFFREY A FAGAN et al., "Isolation of Specific Small-Diameter Single-Wall Carbon Nanotubes Species via Aqueous Two-Phase Extraction", ADVANCED MATERIALS, WILEY-VCH, Vol. 26, 2014, pp. 2800-2804 (hereinafter, Non-Patent Literature 6).

Non-Patent Literature 5 discloses a method in which an excess amount of SWCNT dispersion liquid is poured into a column packed with Sephacryl gel and the temperature of adsorption to the gel is changed to separate the semiconducting SWCNTs having different chiralities from each other.

Non-Patent Literature 6 discloses a method in which aqueous two-phase extraction using polyethylene glycol (PEG) and dextran separates semiconducting SWCNTs having different chiralities. In the aqueous two-phase system containing PEG and dextran, the concentration of sodium dodecyl sulfate (SDS) is changed while the concentration of deoxy sodium cholate (DOC) is retained at a certain level, thereby separating semiconducting SWCNTs with different chiralities from each other.

The use of such semiconducting SWCNTs in which chirality distribution is changed provides a photoelectric conversion device having a higher sensitivity in one or more specific wavelength ranges so as to have desired light absorption characteristics.

Figure 7:
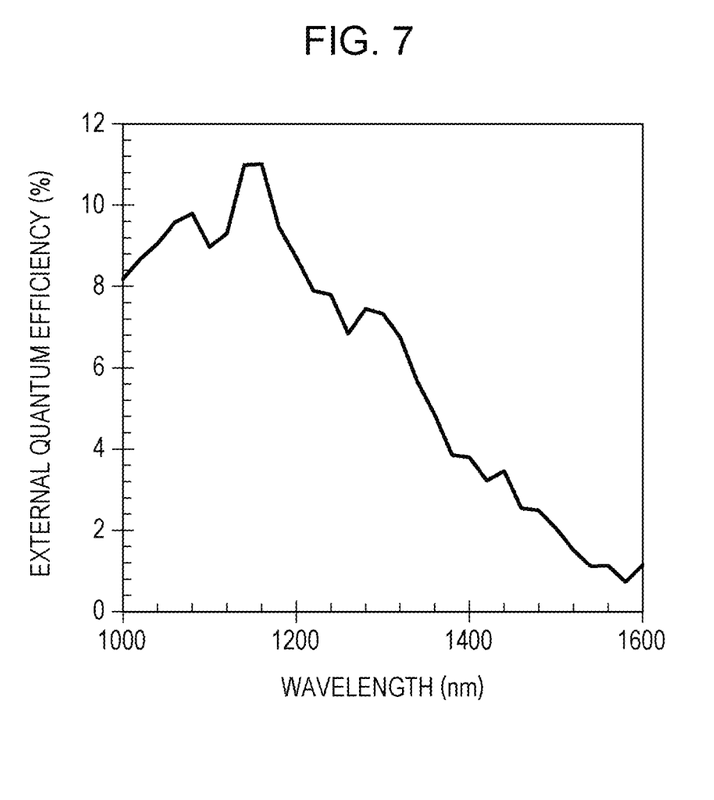
FIG. 7 shows spectral sensitivity characteristics of the external quantum efficiency of the photoelectric conversion element according to the embodiment.

Photoelectric Conversion Efficiency of Photoelectric Conversion Element Evaluation The external quantum efficiency (hereinafter, EQE) of the photoelectric conversion element 10 according to the embodiment was measured. FIG. 7 shows the spectral sensitivity characteristics of the external quantum efficiency of the photoelectric conversion element 10 according to the embodiment.

As shown in FIG. 7, the photoelectric conversion element 10 according to the embodiment has an absorption sensitivity to light having a wide wavelength range of 1,000 nm to 1,500 nm and therefore has a response to light having a wider wavelength range than the photoelectric conversion element described in Non-Patent Literature 2, in which SWNCTs are selectively covered with a polymer.

The photoelectric conversion element 10 according to the embodiment had the highest EQE value of 11%. The photoelectric conversion element described in Japanese Patent No. 5529115, which is produced by covering SWNCTs including the metal type with a polymer, has the highest EQE value of 2.3%. The photoelectric conversion element described in Non-Patent Literature 3, which is produced by separating SWCNTs into semiconducting SWCNTs and metallic SWCNTs and using the semiconducting SWCNTs without wrapping with a polymer, has the highest EQE value of 0.5%. Accordingly, the photoelectric conversion element 10 according to the embodiment was found to have a higher external quantum efficiency than existing photoelectric conversion elements.

As shown in FIG. 7, the photoelectric conversion element 10 according to the embodiment had an EQE of 2% or more in a wavelength range of 1,300 nm or more and 1,500 nm or less. The photoelectric conversion element 10 had an EQE of about 1% or more in a wavelength range of 1,500 nm or more and therefore had a higher external quantum efficiency than existing photoelectric conversion elements.

Accordingly, It was found that the photoelectric conversion element according to the embodiment had absorption sensitivity to light having a wider wavelength range than light to which known photoelectric conversion elements have absorption sensitivity and therefore had a higher external quantum efficiency.

The method for producing the photoelectric conversion element according to the present disclosure and the photoelectric conversion element has been described according to the embodiment, the present disclosure is not limited to this embodiment. Without departing from the spirit of the present disclosure, various modifications to the embodiment, of which a person skilled in the art thinks, and another embodiment created with a combination of parts of components in the embodiment will be in the scope of the present disclosure.

The photoelectric conversion element according to the present disclosure has high photoelectric conversion efficiency in a near-infrared-rays region, so that the photoelectric converter may be used for, for example, an image sensor.

The photoelectric conversion element according to the present disclosure may be used in a solar cell by outputting light-generated charge from the conversion element as energy.

The polymer-wrapped SWCNTs obtained by the method for producing the photoelectric conversion element according to the present disclosure may be used in, for example, films, sheets, glass, and construction materials, as a near-infrared-rays cutting material. The polymer-wrapped SWCNTs may be mixed in inks, resins, and glass, as an infrared-ray absorbent.

In the method for producing a photoelectric conversion element according to the present disclosure, metallic SWCNTs obtained by separating SWCNTs into semiconducting SWCNTs and metallic SWCNTs have excellent electroconductive characteristics and strength, and therefore may be used in, for example, a transparent conducting film of liquid crystal displays.

What is claimed is:

1. A method for producing a photoelectric conversion element, comprising:
    in carbon nanotubes including metallic carbon nanotubes and semiconducting carbon nanotubes having different chiralities from each other, changing a chirality distribution of the semiconducting carbon nanotubes;
    separating the carbon nanotubes into the semiconducting carbon nanotubes and the metallic carbon nanotubes after changing the chirality distribution,
    covering the semiconducting carbon nanotubes with a polymer after performing separating, and
    forming a photoelectric conversion film including the semiconducting carbon nanotubes as a photoelectric conversion material which absorbs light and generates a charge between a pair of electrodes after performing covering with the polymer.

2. The method for producing a photoelectric conversion element according to claim 1,
    wherein covering the semiconducting carbon nanotubes with the polymer is performed in an organic solvent in which the polymer is soluble.

3. The method for producing a photoelectric conversion element according to claim 2,
    wherein the organic solvent is at least one selected from the group consisting of ortho-dichlorobenzene, chlorobenzene, and chloroform.

4. The method for producing a photoelectric conversion element according to claim 2, wherein the organic solvent is at least one selected from the group consisting of toluene and xylene.

5. The method for producing a photoelectric conversion element according to claim 1,
wherein separating the carbon nanotubes into the semiconducting carbon nanotubes and the metallic carbon nanotubes is performed by using at least one selected from the group consisting of gel chromatography and aqueous two-phase extraction.

6. The method for producing a photoelectric conversion element according to claim 1,
wherein separating the carbon nanotubes into the semiconducting carbon nanotubes and the metallic carbon nanotubes is performed by using at least one selected from the group consisting of density-gradient centrifugation, selective solubilization, electrophoresis, and electrical breakdown.

7. The method for producing a photoelectric conversion element according to claim 1,
wherein the polymer is a semiconductive polymer.

8. The method for producing a photoelectric conversion element according to claim 2, further comprising:
removing part of the polymer that does not cover the semiconducting carbon nanotubes and remains in the organic solvent from the organic solvent after performing covering with the polymer and before forming the photoelectric conversion film.

9. The method for producing a photoelectric conversion element according to claim 1, wherein forming the photoelectric conversion film includes:
mixing the semiconducting carbon nanotubes and an n-type semiconductor material with each other; and
forming a photoelectric conversion film including the semiconducting carbon nanotubes and the n-type semiconductor material between the pair of electrodes.

10. The method for producing a photoelectric conversion element according to claim 9,
wherein the n-type semiconductor material contains at least one selected from the group consisting of fullerene and a fullerene derivative.

11. The method for producing a photoelectric conversion element according to claim 1,
wherein the photoelectric conversion element has absorption sensitivity to light having a wavelength range of 1,000 nm to 1,500 nm.

12. A method for producing a photoelectric conversion element, comprising:
separating carbon nanotubes including semiconducting carbon nanotubes having different chiralities from each other and metallic carbon nanotubes into the semiconducting carbon nanotubes and the metallic carbon nanotubes;
changing a chirality distribution of the semiconducting carbon nanotubes after performing separating;
covering the semiconducting carbon nanotube with a polymer after changing the chirality distribution; and
forming a photoelectric conversion film including the semiconducting carbon nanotubes as a photoelectric conversion material which absorbs light and generates a charge between a pair of electrodes after performing covering with the polymer.

13. The method for producing a photoelectric conversion element according to claim 12,
wherein covering the semiconducting carbon nanotubes with the polymer is performed in an organic solvent in which the polymer is soluble.

14. The method for producing a photoelectric conversion element according to claim 13,
wherein the organic solvent is at least one selected from the group consisting of ortho-dichlorobenzene, chlorobenzene, and chloroform.

15. The method for producing a photoelectric conversion element according to claim 13,
wherein the organic solvent is at least one selected from the group consisting of toluene and xylene.

16. The method for producing a photoelectric conversion element according to claim 12,
wherein separating the carbon nanotubes into the semiconducting carbon nanotubes and the metallic carbon nanotubes is performed by using at least one selected from the group consisting of gel chromatography and aqueous two-phase extraction.

17. The method for producing a photoelectric conversion element according to claim 12,
wherein separating the carbon nanotubes into the semiconducting carbon nanotubes and the metallic carbon nanotubes is performed by using at least one selected from the group consisting of density-gradient centrifugation, selective solubilization, electrophoresis, and electrical breakdown.

18. The method for producing a photoelectric conversion element according to claim 12,
wherein the polymer is a semiconductive polymer.

19. The method for producing a photoelectric conversion element according to claim 13, further comprising:
removing part of the polymer that does not cover the semiconducting carbon nanotubes and remains in the organic solvent from the organic solvent after performing covering with the polymer and before forming the photoelectric conversion film.

20. The method for producing a photoelectric conversion element according to claim 12, wherein forming the photoelectric conversion film includes:
mixing the semiconducting carbon nanotubes and an n-type semiconductor material with each other: and
forming a photoelectric conversion film including the semiconducting carbon nanotubes and the n-type semiconductor material between the pair of electrodes.

21. The method for producing a photoelectric conversion element according to claim 20,
wherein the n-type semiconductor material contains at least one selected from the group consisting of fullerene and a fullerene derivative.

22. The method for producing a photoelectric conversion element according to claim 12,
wherein the photoelectric conversion element has absorption sensitivity to light having a wavelength range of 1,000 nm to 1,500 nm.

23. The method for producing a photoelectric conversion element according to claim 1, further comprising:
forming an image sensor including the photoelectric conversion film.

24. The method for producing a photoelectric conversion element according to claim 12, further comprising:
forming an image sensor including the photoelectric conversion film.

* * * * *